United States Patent
Brown et al.

[11] Patent Number: 5,946,245
[45] Date of Patent: Aug. 31, 1999

[54] MEMORY ARRAY TEST CIRCUIT AND METHOD

[75] Inventors: David R. Brown, Sugar Land, Tex.; Shoji Wada, Tokyo, Japan

[73] Assignee: Texas Instruments Incorporated, Dallas, Tex.

[21] Appl. No.: 08/980,098

[22] Filed: Nov. 26, 1997

[51] Int. Cl.⁶ .................................................. G11C 7/00
[52] U.S. Cl. .......................................... 365/201; 365/194
[58] Field of Search ............................... 365/194, 230.03, 365/201

[56] References Cited

U.S. PATENT DOCUMENTS 5,477,492  12/1995  Ohsaki et al. ......................... 365/200
5,777,942  7/1998   Dosaka et al. ..................... 365/230.03
5,812,472  9/1998   Lawrence et al. ...................... 365/201

*Primary Examiner*—David Nelms
*Assistant Examiner*—M. Tran
*Attorney, Agent, or Firm*—Robert N. Rountree; Robby T. Holland; Richard L. Donaldson

[57] ABSTRACT

A circuit for testing a memory cell array 100. The circuit includes a test circuit 104 coupled to the array and includes a data output line 106 and a failure signal output line 108. A shift register 110, which includes a plurality of latches, a clock signal input 114, and an output line 116, is connected to the failure signal output line of the test circuit. The circuit also includes a three-state output buffer driver 118, the buffer driver including a data input line, a failure signal input line, and a data output line. The failure signal line of the buffer driver is connected to the output line of the shift register 110. Upon detecting a defective memory cell in the array, the test circuit produces a failure signal on the failure signal output line 116 of the test circuit. The failure signal is then sent to the shift register 110 causing the buffer driver 118 to enter a high-impedance state in response to said failure signal. The shift register 110 comprises a number of latches in accordance with the desired latency variability of the system or test equipment using the test circuit.

20 Claims, 10 Drawing Sheets

MEMORY ARRAY TEST CIRCUIT AND METHOD

FIELD OF THE INVENTION

This invention relates generally to memory integrated circuits, and more specifically to dynamic random access memory integrated circuits.

BACKGROUND OF THE INVENTION

Dynamic random access memory circuits (DRAMs) are used in computers and other electronic machines requiring temporary storage of data. These circuits have advantages over other types of memory circuits in that they provide the greatest density of memory cells for a given area of semiconductor, a low relative cost-per-bit of stored data, and relatively high speed. DRAMs have increased in both size and in operating speed to match the demands of system designers using modern microprocessors, which often have clock rates in excess of 100 MHz. Indeed, with each new generation of DRAM, the number of memory cells on the integrated circuit increases by a factor of four. In an effort to accommodate systems that demand more and faster data, the industry has turned to DRAMs that synchronize the transfer of data, addresses, and control signals with a clock signal, one that is typically tied to the microprocessor if the system is a computer.

While it is desirable to tie the functioning of the memory to an external clock to speed data transfer and synchronize data input and output, the complexity and size of the circuits that must be accessed to store or retrieve data in a DRAM make it difficult for the memory circuit to respond on every cycle of a high-frequency clock. A solution to this problem is to delay memory operations by a given number of cycles, but eventually have the memory store or retrieve data on the clock cycle as desired by the system designer. This delay in synchronous DRAMs is referred to as "latency." It is a common design practice for the latency of the memory circuit to be selectable by the system designer, typically in increments of 1, 2, or 3 clock cycles, depending upon the operating frequency of the microprocessor upon which a computing system is based, for example.

DRAMs store information in arrays of cells arranged in addressable rows and columns. During fabrication of these devices, one or more defects may occur and prevent the proper performance of the memory circuit. The defects may be randomly distributed. Some types of defects may be analyzed and corrected on the circuit die, while others require that the circuit be scrapped. The testing of the memory circuit to detect these defects can make up a large percentage of the final cost of the device, and the problem is compounded as the capacity of memory circuits continues to increase. Consequently, a great deal of effort has been expended in the industry to produce efficient techniques for testing these circuits.

Traditional test schemes were typically characterized by writing known information into the memory cell array, all Highs or all Lows, for example, and comparing data read from the cells in such a way that if the output of a cell were different from the all Highs or all Lows that had been written into the array, that difference would be detected. In such a two-state test scheme, the test data output was either High or Low, one indicating that all of the cell data was the same, the other indicating that at least one cell produced different data. A problem with this two-state approach is that certain patterns of defects could escape undetected. For example, if the test data written into the array was all 1s (Highs), and the data read out of the array happened to be all 0s (Lows), the simple two-state comparator approach would produce a "pass" for the cells, since they all produced the same data. In other words, this simple two-state approach only looked for differences in data. If all of the data were incorrect, the array would pass inspection as long as all of the data were the same.

Test schemes later evolved to minimize this pattern sensitivity. See, for example, M. Kumanoya, et al., "A Reliable 1-Mbit DRAM with a Multi-Bit-Test Mode," IEEE J. of Solid-State Circuits, vol. SC-20, no. 5, October 1985. In this early three-state approach, identical data (all Highs or all Lows) were written into a memory cell array. Multiple bits of data were then sampled from the array and put through AND logic designed to output a High signal if all the inputs were High, and a Low signal if all the inputs were Low. If, as in these two states, all of the data is the same, either High or Low, the memory cells "pass", or are deemed to be not defective. If, however, one bit is different, the output of the AND logic is in a high-impedance (Hi-Z) state. Therefore, not only could this approach detect the usual single cell failures, but it could also detect if all 0s were produced by the array when all is should have been produced, the pattern defect that often resulted in escapes in the simple two-state technique.

Synchronous DRAMs complicate the testing procedure in that the system, microprocessor, or test apparatus, after triggering the test mode, expects test data to be output after a certain number of cycles have elapsed. Uncertainty in the timing of the test data output could result in a missed indication of failure and the "passing" of a memory circuit that produces defective data. A need exists in the industry for a method of implementing latency control with test circuitry.

SUMMARY OF THE INVENTION

In accordance with a first preferred embodiment of the invention, there is disclosed a circuit for testing a memory cell array. The circuit includes a test circuit coupled to the array and includes a data output line and a failure signal output line. A shift register, which includes a plurality of latches, a clock signal input, and an output line, is connected to the failure signal output line of the test circuit. The circuit also includes a three-state output buffer driver, the buffer driver including a data input line, a failure signal input line, and a data output line. The failure signal line of the buffer driver is connected to the output line of the shift register. Upon detecting a defective memory cell in the array, the test circuit produces a failure signal on the failure signal output line of the test circuit. The failure signal is then sent to the shift register causing the buffer driver to enter a high-impedance state in response to the failure signal. The shift register comprises a number of latches in accordance with the desired latency variability of the system or test equipment using the test circuit. For example, a latency of one, two, or three cycles may be obtained by using two latches in the shift register and activating neither for a latency of one cycle, activating one latch for a latency of two cycles, or activating both latches for a latency of three cycles.

An advantage of the circuit is that the result of a test of the memory cell array may be synchronized through the proper selection of latency to appear at the output of the test circuitry when expected by the system incorporating the memory cell array or by test equipment.

BRIEF DESCRIPTION OF THE DRAWINGS

The foregoing features of the present invention may be more fully understood from the following detailed description, read in conjunction with the accompanying drawings, wherein.

DETAILED DESCRIPTION OF PREFERRED EMBODIMENTS

Figure 1:
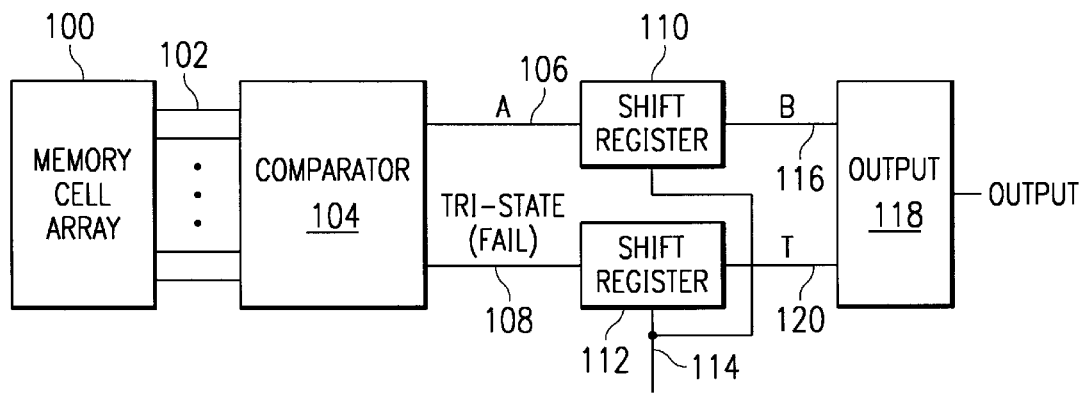
FIG. 1 is a generalized block diagram of a first preferred embodiment circuit.
Figure 20:
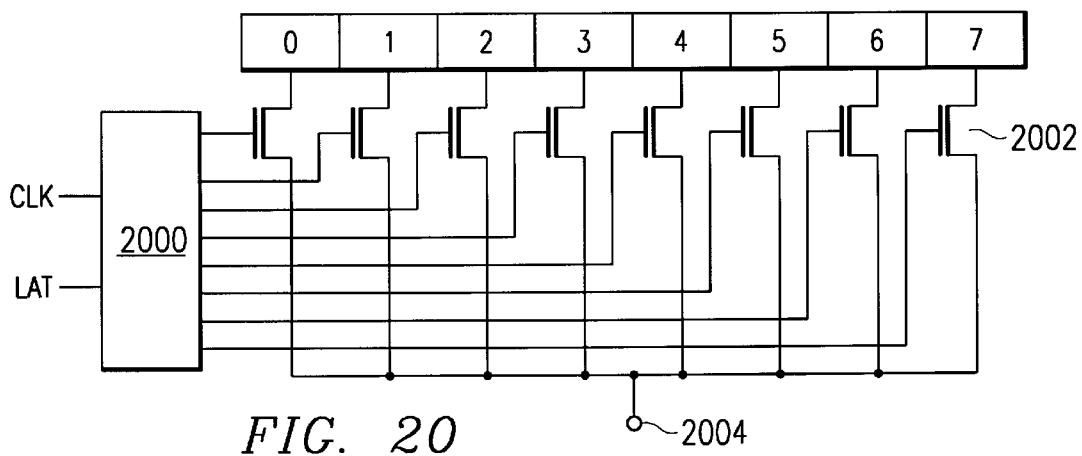
FIG. 20 is one example of a programmable delay circuit.

FIG. 1 is a generalized block diagram of a first embodiment of the invention. The diagram represents design-for-test circuitry for a memory cell array 100. The test circuitry is typically placed on the same semiconductor die on which the memory cell array is fabricated. As a part of the testing of the array, data is written into the array in a particular pattern, typically either all Highs (a logical 1) or all Lows (a logical 0). Data is read from the array 100 on lines 102 to comparator circuitry 104. Comparator circuitry 104 compresses the data down to line 106. Line 108 carries a tri-state fail signal from the comparator in the event that one of the bits read from the array 100 is different from that expected (either all 1s or 0s). Shift register block 110 controls the latency in the data path, while shift register 112 controls the latency in the tri-state path. The shift registers operate in conjunction with a clock signal on line 114. One skilled in the art will appreciate that other forms of programmable delay circuitry may be used to implement latency instead of shift registers. An example of such a circuit is shown in FIG. 20. After the data in the data path and tri-state paths are subjected to the desired latency period in shift registers 110 and 112, respectively, the data is sent along line 116 to the output circuitry block 118. Output circuitry block 118 contains circuitry that disables data output in the event that a tri-state fail signal is output from shift register 112 along line 120.

Figure 2:
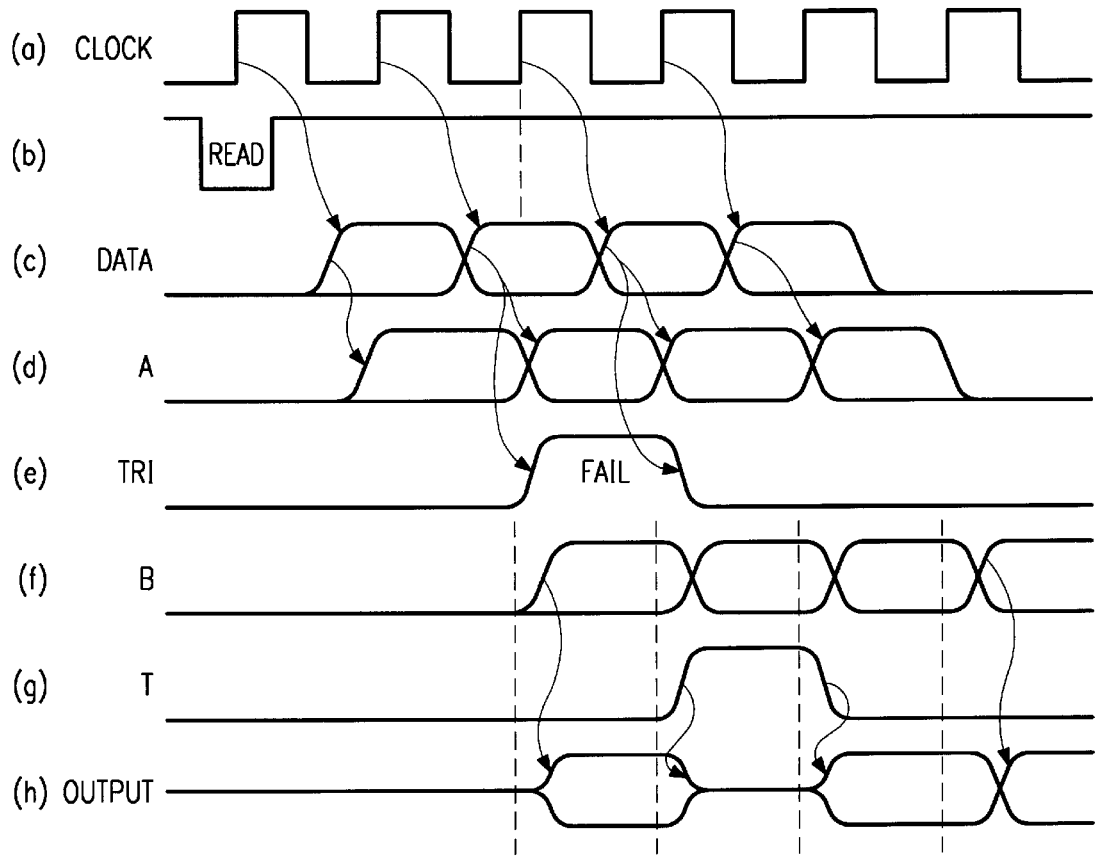
FIG. 2 is a timing diagram for the circuit of FIG. 1.

FIG. 2 is a timing diagram illustrating the functioning of the circuit shown in FIG. 1. Line (a) is the clock signal on line 114 in FIG. 1. On line (b) a read command is given to begin the clocking of data out of the array on lines 102. Line (c) is the data being read out of the array. Line (d) is the output of the comparator circuitry block 104. Line (e) represents a tri-state fail signal on line 108 of the circuit of FIG. 1. Line (f) is the output of shift register 110 (delayed by one clock cycle; that is, the latency period is "one" for this timing diagram) on line 116. Line (g) is the output of shift register 112, also delayed by one clock cycle. The output of the output circuitry block 118 is shown in line (h), where the effect of the tri-state fail signal is made apparent by the disabling of the data stream being sent to the output circuitry block 118 along line 116. By holding the tri-state fail signal in shift register 112 for the desired latency period, the circuit ensures that the system or test equipment is ready for the disabled output at the time the signal is sent. If for some reason the output is disabled by the tri-state fail signal at a time other than that expected by the system or test equipment, a defect could escape detection.

Figure 18:
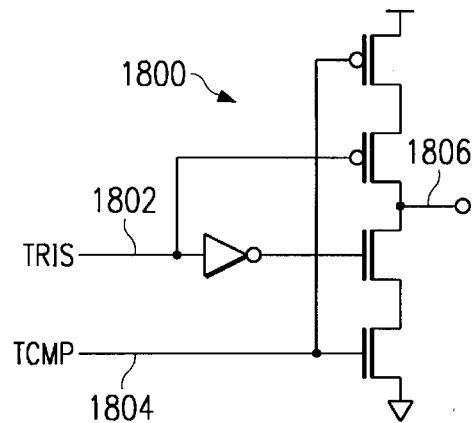
FIG. 18 is a schematic diagram of an output buffer driver.

Line (h) of FIG. 2 shows that the output of the test circuit is at an intermediate voltage level when the output is disabled by the delayed tri-state fail signal "T" on line (g) of FIG. 2. The intermediate voltage is achieved by loading the output of circuitry block 118 with a circuit having a relatively small time constant such as that shown in FIG. 19. The circuit of FIG. 19 drives the output of the buffer driver (shown in FIG. 18 for example) to the intermediate voltage of approximately 1.4 Volts when the fail signal "T" is presented to the buffer driver input. A load circuit having a small time constant is desirable to allow the output to achieve the intermediate voltage level within a clock cycle.

A more detailed description of the test scheme is set forth hereinbelow with reference to a 64 Mb synchronous DRAM. The skilled artisan will appreciate that the techniques are equally applicable to memory configurations and capacities different than those described. The test scheme described herein comprises two modes of tri-state test operation, as well as a simple two-state test operation.

Figure 3:
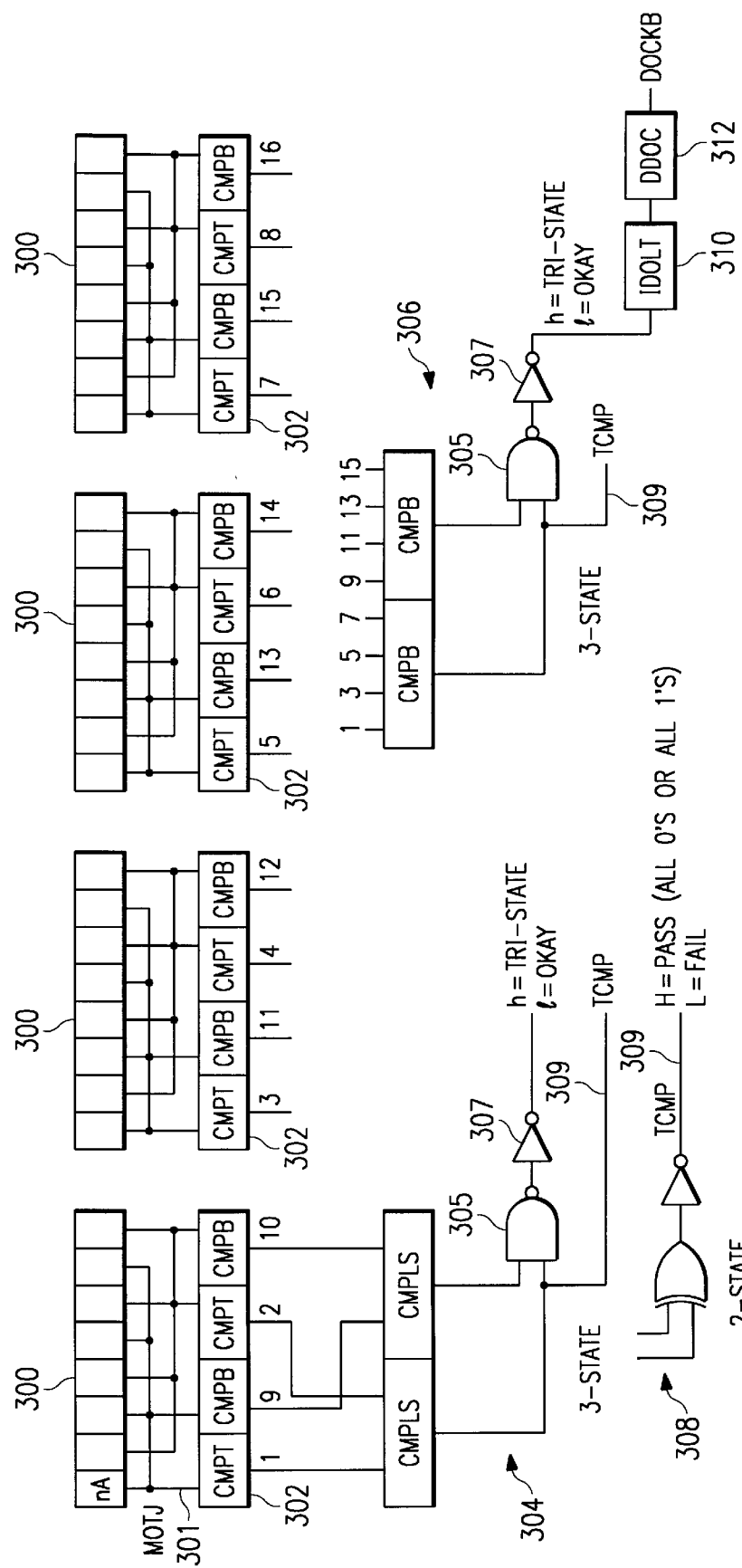
FIG. 3 is a generalized block diagram showing three test circuits.

FIG. 3 is a simplified block diagram representing each of the three test modes. The memory array is divided into eight sections. Main amplifiers 300 each provide a bit of data from a particular cell within one of the eight sections. Only four main amplifier blocks 300 are shown in FIG. 3, but it should be understood that the circuitry is replicated for the remaining four sections of memory array. During a read operation in the test mode, the data in the main amplifiers 300 is sent along lines MOTJ 301 to comparator circuitry 302. The comparator circuitry 302 is the same for all three modes of test operations: the rapid three-state test, the thorough three-state laser probe test, and the simple two-state test. The three-state laser probe test is represented in FIG. 3 by circuitry 304, the rapid three-state test is represented by circuitry 306, and the simple two-state test by circuitry 308. No matter which test circuitry is selected by the user, the test output is sent to an IDOLT circuitry block 310, which contains the shift registers that produce the desired latency. The data then goes to the DDOC circuitry block 312, which puts a tri-state output buffer into its high impedance state if a fail signal, DOCKB, has been output by one of the three-state test modes 304 or 306. If no fail signal is produced by one of the circuits 304 or 306, or if the two-state test circuitry 308 is used, the output buffer is enabled to send out the data (on lines TCMP 309) received from whichever of the three test circuits the system or user desires. It should be understood that the circuitry shown here is dedicated test circuitry that parallels the operating circuitry of the memory array. By using this parallel approach, no signal delay is introduced into the data path used in the normal operation of the memory circuit.

Figure 4:
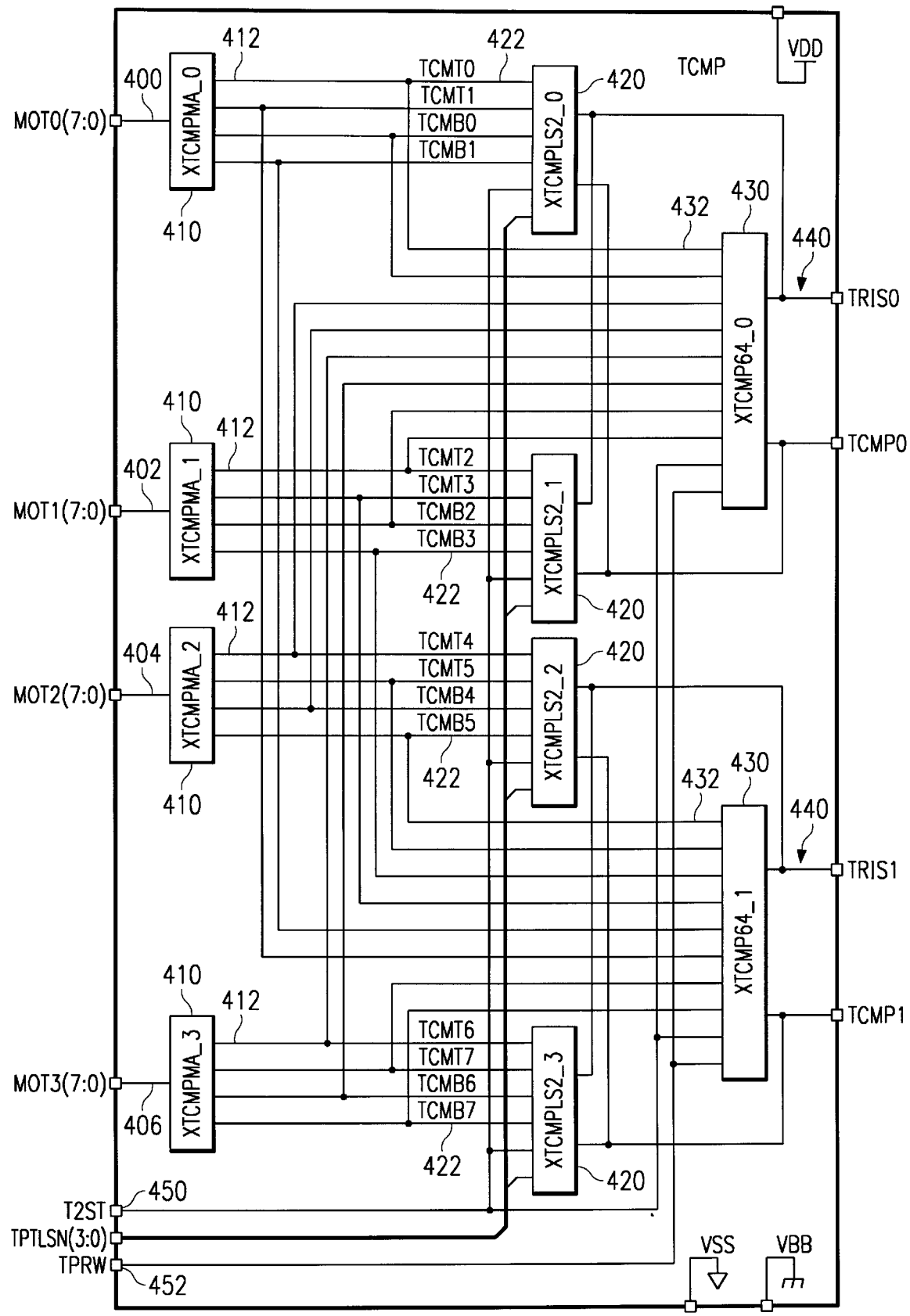
FIG. 4 is a schematic diagram of the circuitry shown in FIG. 3.

FIG. 4 is a more detailed schematic diagram of the comparator circuitry shown in FIG. 3 in elements 304, 306, and 308, which is again only one-half of the test circuitry for the eight sections of memory cells comprising the entire 64 Mb array. Lines 400, 402, 404, and 406 each represent eight data lines from the main amplifiers of the four sections of the memory cell array described above with reference to FIG. 3. These lines correspond to lines MOTJ 301 in FIG. 3. Blocks 410 are the first stage for comparison of the data on the MOT lines 400, 402, 404, and 406. The circuitry encountered prior to and including blocks 410 is common to all three test mode circuits. The circuitry occurring after blocks 410 is divided primarily into the two three-state test modes: the laser probe test circuit and the rapid test circuit. Circuitry for a simple two-stage test is included in each of the three-state test circuits as will be made apparent below.

Blocks 420 represent the circuitry dedicated to the laser probe test, while blocks 430 represent the circuitry dedicated to the rapid test. These tests are similar, except the rapid test circuitry compresses the data from the blocks 410 with less circuitry than is done with the laser probe test circuitry. This difference is made apparent by inspecting the number of input lines 422 to each block 420, as compared to the number of lines 432 entering each block 430. Whichever test circuit comparator the operator chooses to run, the output of each circuit is tied to output lines 440, which comprise both a tri-state line, TRIS0, and a data line, TCMP0. These outputs are also compared and sent to the IDOLT 310 and DDOC 312 circuit blocks shown in FIG. 3 for latency implementation and the possible disabling of data in the event of a defect detection. Selection of a two-state test circuit is made by providing the proper signal on line 450, labeled "T2ST." The line 452, labeled "TPRW" controls the power to the rapid test circuitry 430 so that it may be powered-off to save power when the memory circuit is not in test mode.

Figure 5:
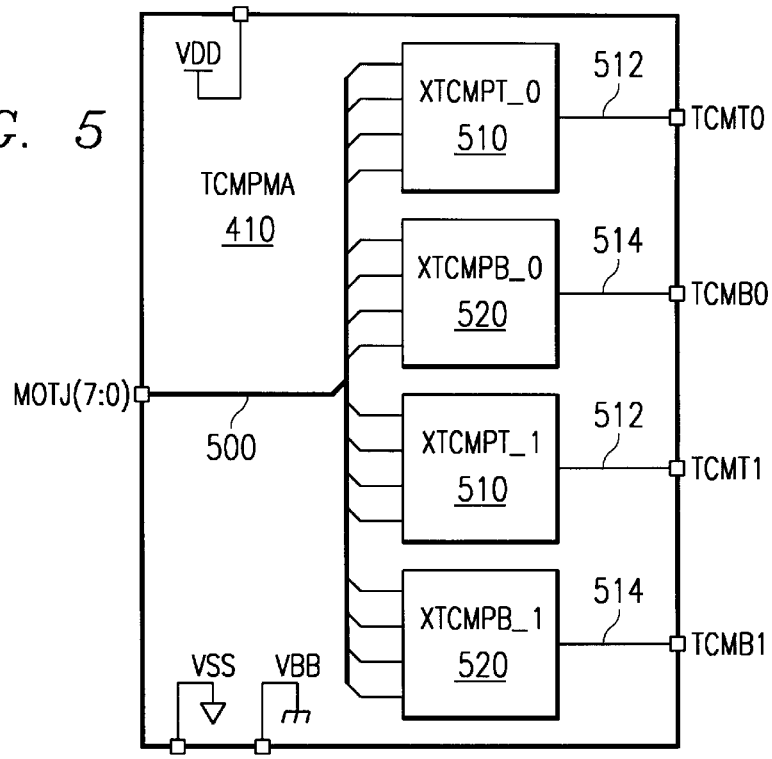
FIG. 5 is a detailed diagram of a generalized circuitry block in FIG. 4.

FIG. 5 is a schematic diagram of the block 410 shown in FIG. 4. Lines 500 are one of the sets of lines 400, 402, 404, or 406 shown in FIG. 4. The eight data lines that comprise lines 500 are routed to true data circuitry blocks 510 and complementary, or bar, data circuitry blocks 520. The division of the data into true data and complementary data provides a redundancy to the testing and therefore results in a more robust test procedure than if only the true form of the data were compared and tested.

Figure 6:
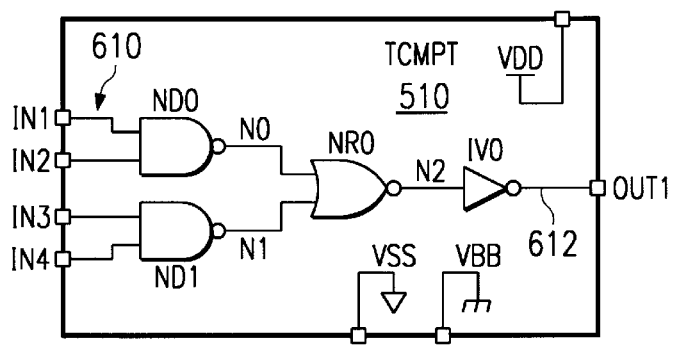
FIG. 6 is a detailed diagram of a generalized circuitry block in FIG. 5.
Figure 7:
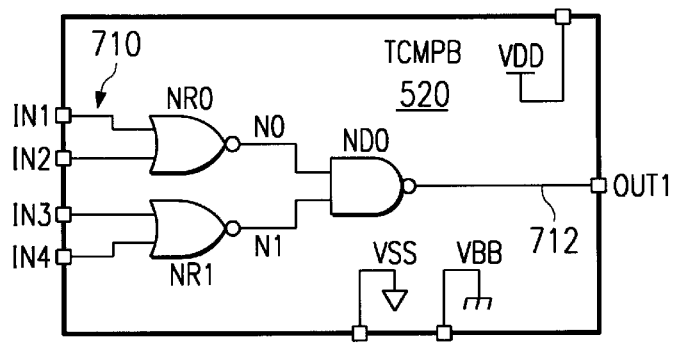
FIG. 7 is a detailed diagram of a generalized circuitry block in FIG. 5.

FIG. 6 is a schematic diagram of the true data circuitry block 510 shown in FIG. 5. Data on four lines 610 are compressed to a single bit of data on output line 612, which corresponds to one of the true data lines 512 in FIG. 5. Similarly, FIG. 7 is a schematic diagram of the complementary data circuitry block 520 shown in FIG. 5. Data on four lines 710 are compressed to a single bit of data on output line 712, which corresponds to one of the complementary data lines 512 in FIG. 5. The logic circuitry of FIG. 7 produces on output line 712 the complement of the data on line 612. This presumes of course that all of the data on lines 610 and 710 are the same, which is typically the case in array testing. If one of the lines contains data that is different, that fact will be detected in subsequent circuitry and a defect in the memory array will be indicated to the system or test equipment.

Figure 8:
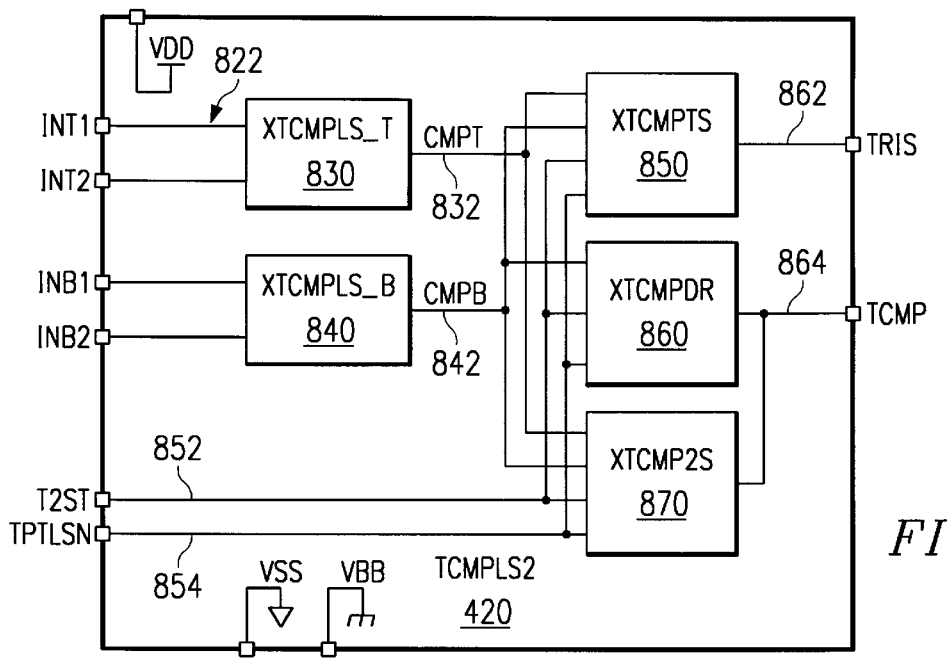
FIG. 8 is a detailed diagram of a generalized circuitry block in FIG. 4.

FIG. 8 is a schematic diagram of one of the laser test circuitry blocks 420 shown in FIG. 4. True data from blocks 410 enters true data circuitry block 830 and complementary data from blocks 410 enters complementary data circuitry block 840 on lines 822. The output of block 830 is then sent along lines 832 to the tri-state failure signal driver circuitry block 850 and the two-state signal driver circuitry block 870. The output of block 840 is sent along lines 842 to the tri-state failure signal driver circuitry block 850, the tri-state data driver circuitry block 860, and the two-state signal driver circuitry block 870. The signal on line 852 controls whether one of the three-state test circuits in blocks 850 and 860 is being used, or whether the simple two-state circuitry in block 870 is being used. Line 862 is the tri-state failure signal output, while line 864 is the data output. The TPTLSN line 854 allows the drive circuits 850, 860, and 870 to be turned off to save power when the memory circuit is not in test mode.

Figure 9:
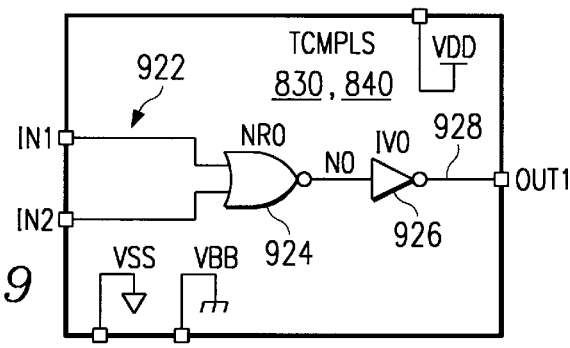
FIGS. 9 to 12 are detailed diagrams of generalized circuitry blocks in FIG. 8.

FIG. 9 is a schematic diagram of the logic circuitry of blocks 830 and 840 shown in FIG. 8. The data inputs on lines 922 are simply compressed using a NOR gate 924 and an inverter 926. The output line 928 corresponds to lines 832 and 842 of FIG. 8.

Figure 10:
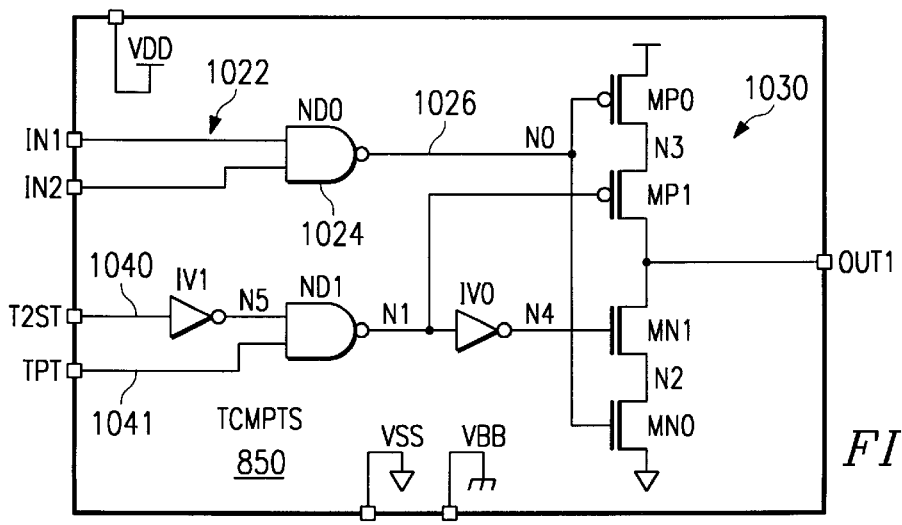

FIG. 10 is a schematic diagram of the tri-state failure signal driver circuitry block 850 of FIG. 8. Inputs 1022 correspond to true and complementary data lines 832 and 842 of FIG. 8. The signals are compressed to a single signal by NAND gate 1024, the output of which becomes the input of drive buffer 1030. The drive buffer 1030 can be disabled by the proper signals on lines T2ST 1040 and TPT 1041 to produce a logic 1 at node N1 and turn off transistors MP1 and MN1. This function is used if, for example, the system or test equipment desires the simple two-state test mode, the proper signal is placed on line 1040 to disable the drive buffer 1030. It may be appreciated that when the output drive buffer 1030 is enabled, it produces on line 1032 the inverse of the signal on line input line 1026.

Figure 11:
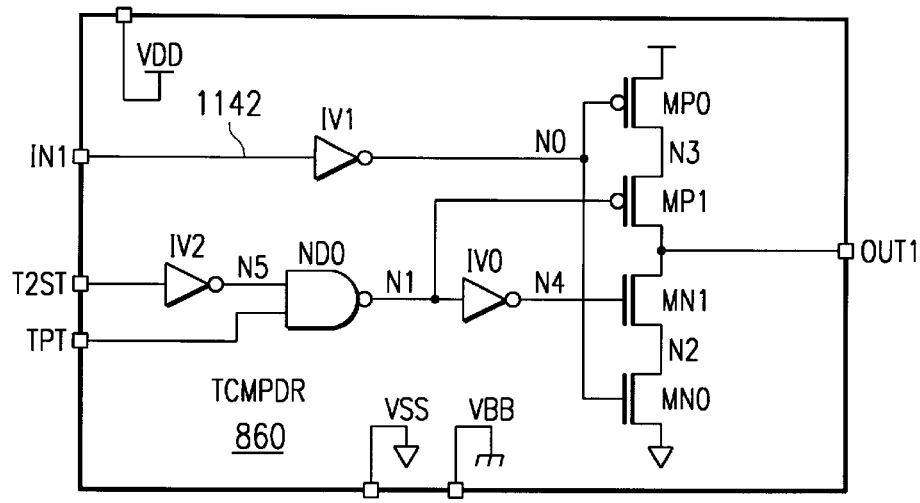

FIG. 11 is a schematic diagram of the tri-state data driver circuitry block 860 shown in FIG. 8. Line 1142 corresponds to line 842 in FIG. 8. The buffer driver 1130 functions in the same way as driver 1030 described above.

Figure 12:
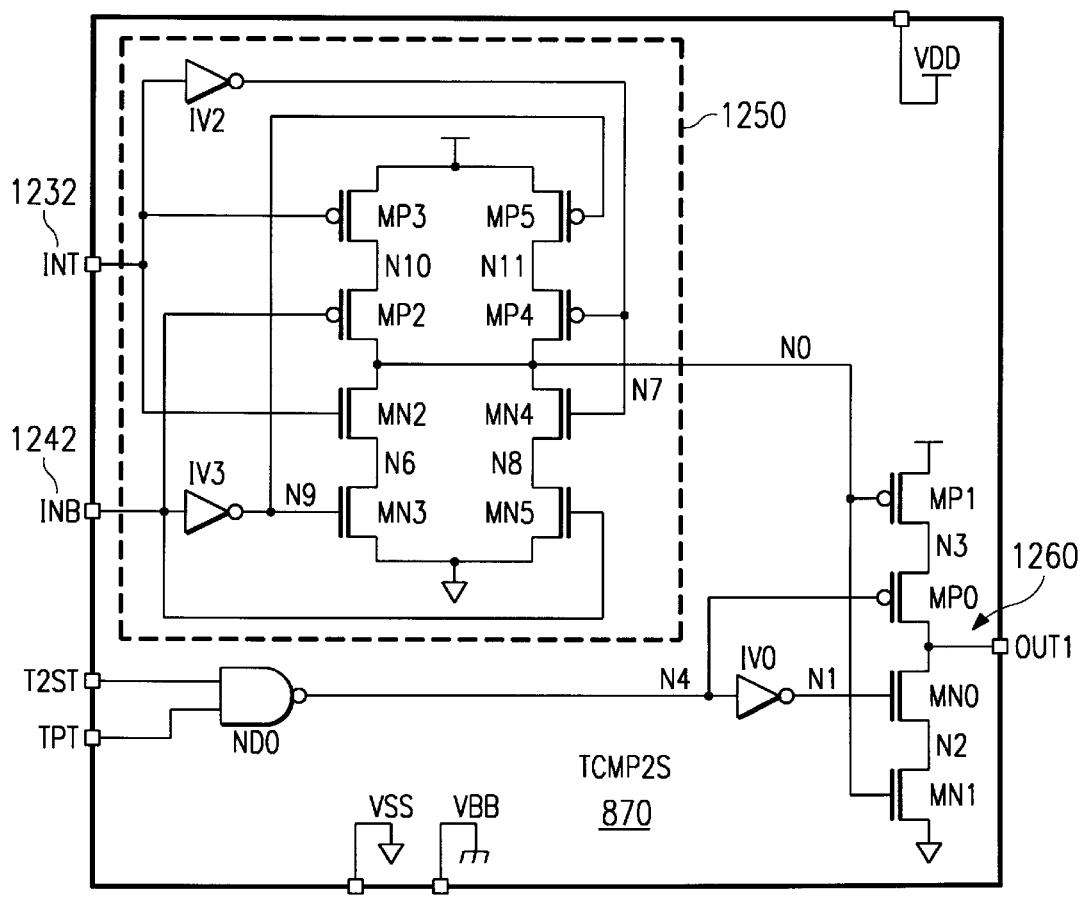

FIG. 12 is a schematic diagram of the two-state signal driver circuitry block 870 in FIG. 8. Lines 1232 and 1242 correspond to lines 832 and 842, respectively. Block 1250 is an exclusive OR gate that compresses the signals on lines 1232 and 1242 to a single signal, which becomes the input to buffer driver 1260. Buffer driver 1260 functions similarly to drivers 1030 and 1130 above.

Figure 13:
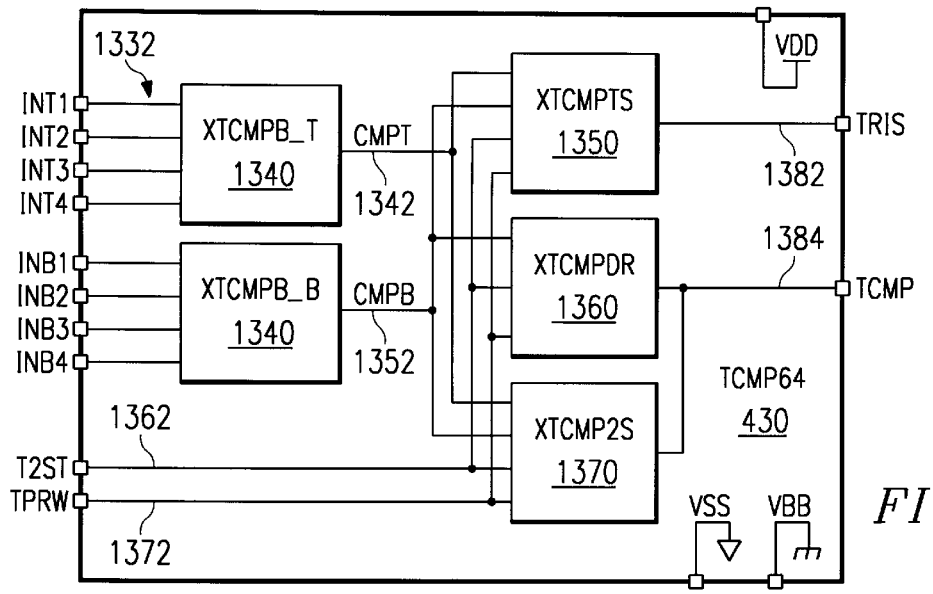
FIG. 13 is a detailed diagram of a generalized circuitry block in FIG. 4.

FIG. 13 is a schematic diagram of one of the rapid test circuitry blocks 430 shown in FIG. 4. Lines 1332 correspond to lines 432 in FIG. 4. Logic circuitry blocks 1340 compress the signals on four true data input lines and four complementary data input lines to a single true data output and a single complementary data output on lines 1342 and 1352, respectively. Lines 1342 and 1352 lead to the tri-state failure signal driver circuitry block 1350 and the two-state signal driver circuitry block 1370. Line 1352, the complementary data line, also goes to the tri-state data driver circuitry block 1360. The signal on line 1362 controls whether one of the three-state test circuits in blocks 1350 and 1360 is being used, or whether the simple two-state circuitry in block 1370 is being used. Line 1372 carries the read/write test signal, which turns off the power to the driver circuit blocks when the memory circuit is not in test mode. Line 1382 is the tri-state failure signal output, while line 1384 is the data output. The tri-state failure signal driver circuitry block 1350, the tri-state data signal driver block 1360, and the simple two-state circuitry block 1370 are identical to blocks 850, 860, and 870, which are described above with reference to FIGS. 10, 11, and 12, respectively.

Figure 14:
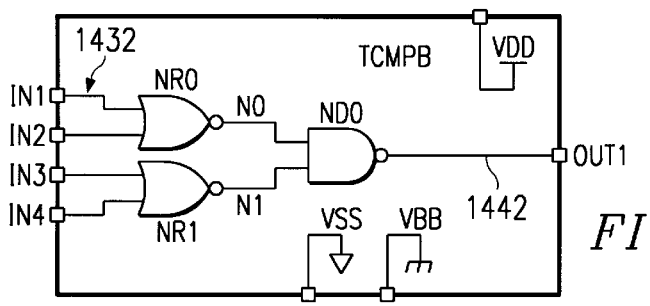
FIG. 14 is a detailed diagram of a generalized circuitry block in FIG. 13.

FIG. 14 is a schematic diagram of logic circuitry blocks 1340 in FIG. 13. Lines 1432 correspond to lines 1332 of FIG. 13 and line 1442 corresponds to line 1342 or 1352.

Referring again to FIG. 4, the TRIS0 and TRIS1 tri-state signal lines 440 are further compressed by a NAND gate. The signal is then inverted. The NAND gate is shown as element 305 and the inverter is shown as element 307 in FIG. 3. These elements are shown in that Figure as appearing at the output of both the laser probe test circuitry 304 and the rapid test circuitry 306, because the outputs in the actual circuit schematic, FIG. 4, are combined on lines 440, which are common to both three-state circuits. After exiting the inverter 307, the tri-state signal enters the circuitry described in FIG. 15.

Figure 15:
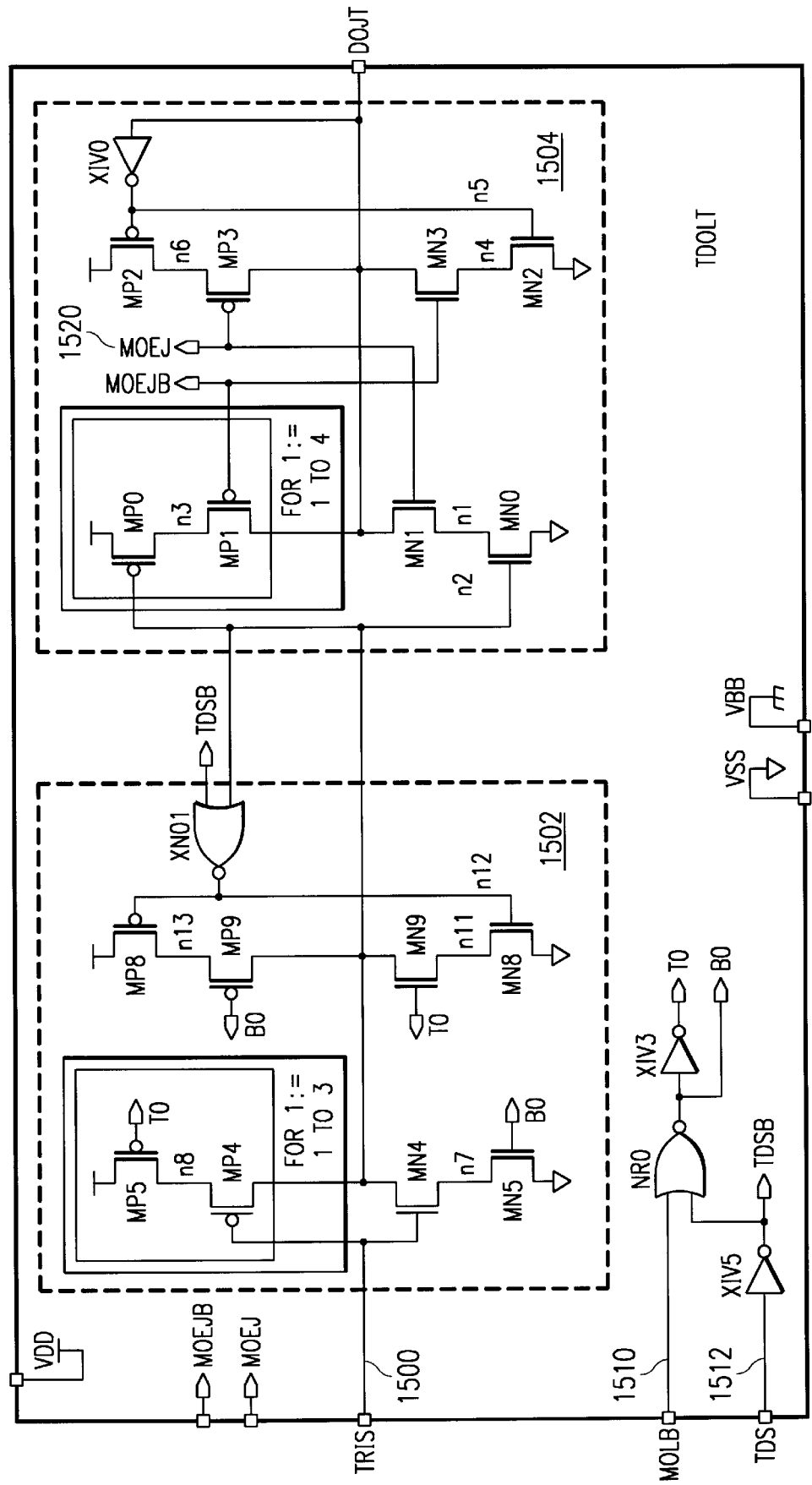
FIG. 15 is a detailed schematic diagram of generalized circuitry block 310 in FIG. 3.

FIG. 15 is a schematic diagram of the IDOLT shift register block 310 shown in FIG. 3. The circuit of FIG. 15 contains two latches 1502 and 1504 that allow the user or system to select one, two, or three clock cycles of latency to ensure that a tri-state failure signal is synchronized to occur when the system or test equipment expects to see such a signal. Line 1500 corresponds to the output of the inverter 307 in FIG. 3. The operation of latches 1502 and 1504 is controlled by the edge of a system clock signal. The system turns on the first latch 1502 by sending a pulse on line 1510 that is synchronized with an edge of the clock signal. Latch 1504 is controlled by pulses from the circuitry shown in FIG. 16 that enters the circuitry of FIG. 15 on the lines 1520 labeled MOEJB and MOEJ. Line 1512 carries the signal that alerts the latches for incoming data.

Latency of one cycle is accomplished by turning off both latches 1502 and 1504, allowing the data to flow through. The latency is one and not zero because of the cycle of delay associated with extracting the data from the array. Latency of two cycles is accomplished by turning on the first latch 1502 and keeping the second latch 1504 off allowing data to flow through. Turning on the first latch results in the storing of a tri-state failure signal for one extra cycle, or a total of two cycles. Turning on both latches results in the storing of a tri-state failure signal for two extra cycles, or a total of three cycles. Once the tri-state failure signal is stored for the desired latency period, the signal is sent to the output enable circuitry shown in FIG. 17.

Figure 16:
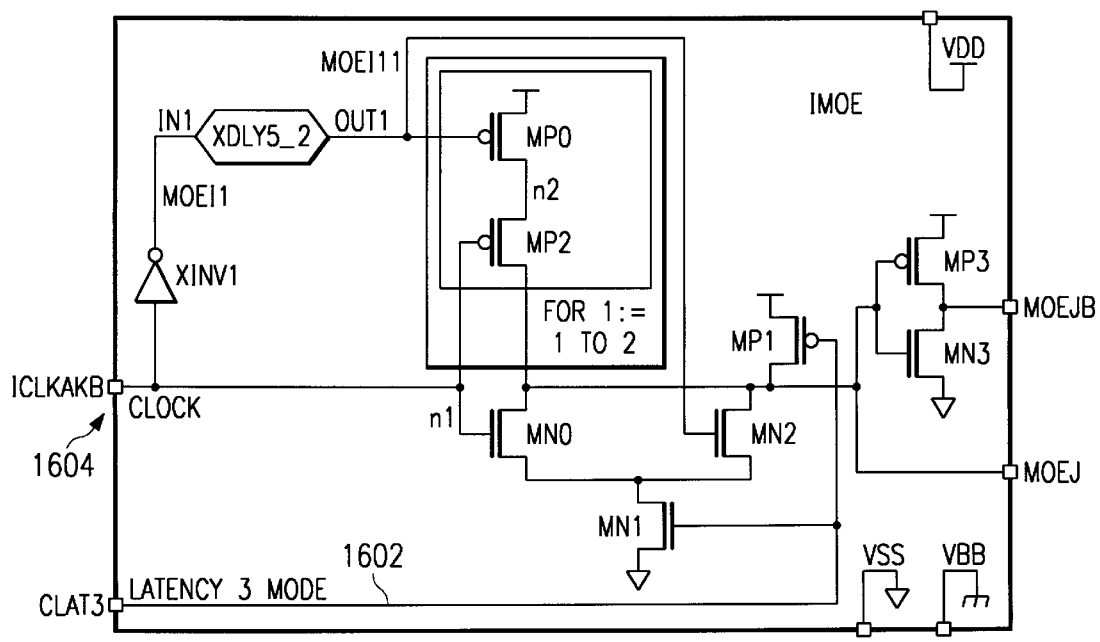
FIG. 16 is a schematic diagram of control circuitry for the second latch 1504 in FIG. 15.

FIG. 16 is a schematic diagram of the circuitry for producing the signals, MOEJB and MOEJ, that turn on the second latch 1504. The system signal to implement the latency of three cycles is carried on line 1602 and the actuation of latch 1504 is synchronized by the clock signal on line 1604.

Figure 17:
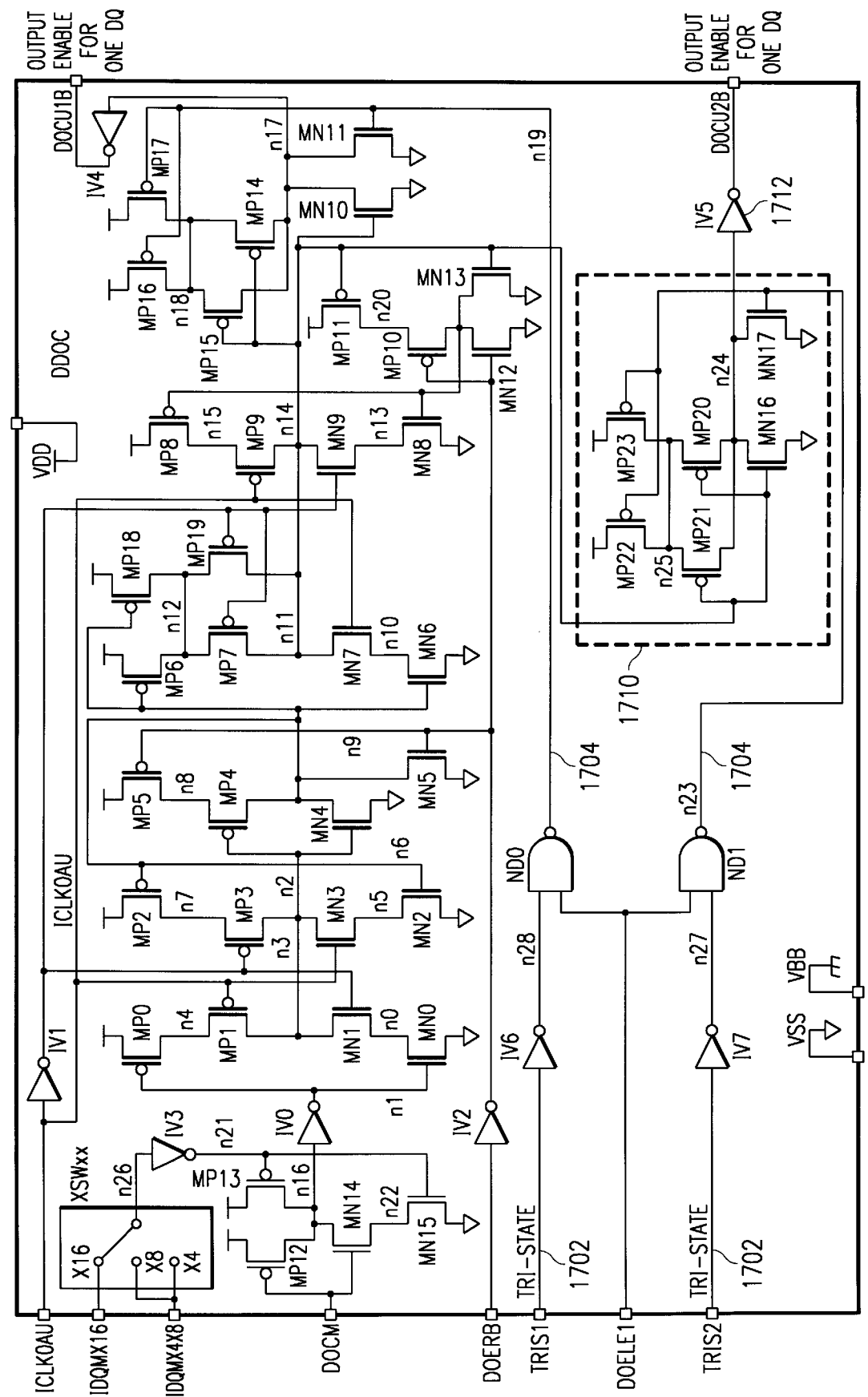
FIG. 17 is a schematic diagram of generalized circuitry block 312 in FIG. 3.

FIG. 17 is the DDOC circuitry block 312 of FIG. 3. The tri-state failure signal enters the circuit on lines 1702. Two tri-state failure signal lines 1702 are shown because the memory circuit has two outputs, one for each half of the memory array, dedicated to this test mode. The tri-state failure signal advances along lines 1704 to a NOR gate 1710 and then to inverter 1712.

The output of the DDOC circuitry shown in FIG. 17 is the DOCKB signal shown in FIG. 3. In the event of a defect in the memory array, a tri-state failure signal, the DOCKB signal, is produced by the circuit of FIG. 17 to disable the data output from the memory circuit as described with reference to the timing diagram of FIG. 2. The disabling of the output is accomplished by forcing a three-state output buffer (shown in FIG. 18) into its high-impedance state. The DOCKB signal produced by the circuit of FIG. 17 is the triggering signal on line 1802 that puts the buffer 1800 into the high-impedance state. In the absence of the DOCKB signal, that is, when no memory cell defect has been detected, the DOCKB signal is in a state that does not activate the high-impedance state of the tri-state output buffer 1800. The output buffer 1800 then outputs data (typically either all logic 1s or 0s) retrieved from the array and compressed by the comparator circuitry described with reference to FIGS. 3 to 17. The data from the comparator circuit enters the buffer on line 1804 and exits after being inverted on line 1806. In other words, if the comparator circuitry produces a "pass", the output circuitry produces a high or low signal in accordance with the data loaded into the array for the test. If the comparator circuitry produces a "fail," the output circuitry produces a "high-z" condition, that is, it "tri-states" or floats (does not draw or source current) as opposed to being pulled high or low as with the pass condition. The output is synchronized by the latency control circuitry of FIG. 15 such that the pass data or the fail signal appears at the output when the system or test equipment expects it to appear.

Figure 19:
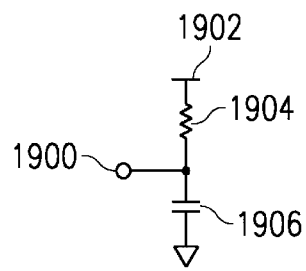
FIG. 19 is a load circuit for the output of the buffer driver of FIG. 18.

FIG. 19 is a load circuit for the output of the buffer driver (line 1806 of FIG. 18 for example) that forces the output to a particular voltage when the buffer driver is in its tri-state or high impedance state. The load circuit is typically off-chip in test equipment, for example, but alternatively may be on the die on which the memory circuit is fabricated. The load may take many forms, depending in particular upon the time constant that determines how quickly the circuit can respond to changes in voltage on line 1900. The output of the buffer driver is connected to line 1900. The desired voltage of the buffer driver in its high-impedance state is placed at node 1902. A typical intermediate voltage on node 1902 is 1.4 Volts. Resistor 1904 and capacitor 1906 are selected to present the desired loading characteristics and time constant. For example, resistor 1904 can be approximately 50 ohms, while capacitor 1906 can be approximately 50 pF. This selection of component values allows the load circuit to drive the output of the buffer driver to the intermediate voltage level even within the very fast clock cycles used in modern microprocessors.

FIG. 20 is one example of a programmable delay circuit that may be used to implement latency cycles, rather than using the shift registers described above. Data is read from locations 0 through 7 in a sequence dictated by circuitry block 2000. Circuit block 2000 can include a counter or other decode circuitry to select the sequence in which pass transistors 2002 are activated to pass the data to the output node 2004. The circuit of FIG. 20 can be made to function as a shift register by simply including a counter in circuit block 2000 to release data from locations 0 through 7 in succession. These operations can be synchronized with a clock signal input to circuit block 2000. Other forms of programmable delay circuits include multiplexers and demultiplexers that allow the sequencing of data transfer.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, the number of latency cycles could be increased by inserting additional latches in the circuit of FIG. 15. In addition, in the embodiment shown in FIG. 1, the programmable delay circuit, shown as shift register 112, could be placed between the memory cell array and comparator, rather than between the comparator and output buffer driver as shown. It is therefore intended that the appended claims encompass any such modifications or embodiments.

What is claimed is:

1. A circuit for testing a memory cell array, comprising:
    a test circuit coupled to said array, said test circuit including a data output line and a failure signal output line;
    a programmable delay circuit connected to said failure signal output line of said test circuit, said programmable delay circuit including a clock signal input, and an output line;

an output buffer driver, said buffer driver including a data input line, a failure signal input line, and a data output line, said data input line of said buffer driver connected to said data output line of said test circuit, said failure signal line of said buffer driver connected to said output line of said programmable delay circuit;

wherein upon detecting a defective memory cell in said array, said test circuit produces a failure signal on said failure signal line output line of said test circuit, said failure signal entering said programmable delay circuit and causing said buffer driver to enter a high-impedance state in response to said failure signal.

2. The circuit of claim 1, wherein said programmable delay circuit is a shift register.

3. The circuit of claim 2, wherein said shift register comprises two latches.

4. The memory test circuit of claim 3, wherein said latches in said shift register may be activated or inactivated to delay said failure signal for a predetermined number of cycles of a clock signal on said clock signal input.

5. The memory test circuit of claim 2, wherein said shift register contains two latches, the activation of each of said latches being independent of one another and responsive to an external input to produce a delay of said failure signal in reaching said buffer driver of one, two, or three cycles.

6. The circuit of claim 1, wherein said buffer driver is a tri-state buffer driver.

7. The circuit of claim 1, further comprising a load, said load forcing a voltage on said data output line of said buffer driver to an intermediate level in response to said buffer driver entering a high-impedance state.

8. A circuit for testing a memory cell array, comprising:

a test circuit coupled to said array, said test circuit including a data output line and a failure signal output line;

a shift register connected to said failure signal output line of said test circuit, said shift register including a plurality of latches, a clock signal input, and an output line;

a three-state output buffer driver, said buffer driver including a data input line, a failure signal input line, and a data output line, said data input line of said buffer driver connected to said data output line of said test circuit, said failure signal line of said buffer driver connected to said output line of said shift register;

wherein upon detecting a defective memory cell in said array, said test circuit produces a failure signal on said failure signal line output line of said test circuit, said failure signal entering said shift register and causing said buffer driver to enter a high-impedance state in response to said failure signal.

9. The memory test circuit of claim 8, wherein said latches in said shift register may be activated or inactivated to delay said failure signal for a predetermined number of cycles of a clock signal on said clock signal input.

10. The memory test circuit of claim 8, wherein said shift register contains two latches, the activation of each of said latches being independent of one another and responsive to an external input to produce a delay of said failure signal in reaching said buffer driver of one, two, or three cycles.

11. An integrated circuit, comprising:

a memory circuit arranged to produce a plurality of data bits at a first time;

a logic circuit coupled to receive the plurality of data bits, the logic circuit arranged to produce a compressed data bit and a tristate signal, the compressed data bit having a logic state corresponding to the plurality of data bits in response to a no error state, the tristate signal having a first logic state in response to said no error state and having a second logic state in response to an error state;

a register circuit coupled to receive the tristate signal and a clock signal, the register circuit arranged to produce a delayed tristate signal after a number of clock signal cycles; and an output circuit coupled to receive the compressed data bit and the delayed tristate signal, the output circuit arranged to produce the compressed data bit at a data output terminal in response to said no error state, the output circuit arranged to produce a high impedance state at the data output terminal in response to said error state.

12. An integrated circuit as in claim 11, wherein the number of clock signal cycles is determined by a latency control signal.

13. An integrated circuit as in claim 12, wherein the number of clock signal cycles is one.

14. An integrated circuit as in claim 11, wherein the logic circuit comprises a comparator circuit arranged to compare logical states of each of the plurality of data bits, wherein a same logic state of each of the plurality of data bits comprises a no error state and wherein a different logic state of at least one of the plurality of data bits comprises an error state.

15. An integrated circuit as in claim 11, wherein said each of the plurality of data bits comprises a true signal and a complement signal and wherein the compressed data bit comprises a logical combination of each true signal and a logical combination of each complement signal.

16. An integrated circuit as in claim 15, wherein the logical combination of each true signal is one of a logical AND and a logical OR, and wherein the logical combination of each complement signal is the other of the logical AND and the logical OR.

17. An integrated circuit as in claim 11, wherein each of the plurality of data bits has a same logic state in response to said no error state, and wherein at least one of the plurality of data bits has a different logic state in response to said error state.

18. An integrated circuit as in claim 11, wherein the register circuit is further coupled to receive the compressed data bit, and wherein the register circuit is arranged to produce the compressed data bit and the delayed tristate signal after said number of clock signal cycles.

19. An integrated circuit as in claim 18, wherein the memory circuit produces a second plurality of data bits at a second time, wherein the logic circuit produces a second compressed data bit and a second tristate signal, and wherein the register circuit produces the second compressed data bit and a second delayed tristate signal one clock signal cycle after said number of clock signal cycles.

20. An integrated circuit as in claim 11, wherein the logic circuit is further coupled to receive a test control signal, and wherein the tristate signal has the first logic state in response to said error state and the test control signal.

* * * * *

UNITED STATES PATENT AND TRADEMARK OFFICE
CERTIFICATE OF CORRECTION

PATENT NO. : 5,946,245
DATED : August 31, 1999
INVENTOR(S) : Brown, et al

It is certified that error appears in the above-identified patent and that said Letters Patent is hereby corrected as shown below:

Title page, insert the following: after item [22],
-- [60] Provisional application No. 60/032,056, Nov. 27, 1996 and 60/031,851, Dec. 5, 1996 --

Column 1, line 4, insert the following:
-- CROSS REFERENCE TO RELATED APPLICATION
Reference is made to and priority claimed from U.S. Provisional Application Serial No.60/032,056, Nov. 27, 1996 and 60/031,851, Dec. 5, 1996 --

Signed and Sealed this

Seventh Day of March, 2000

Attest:

Q. TODD DICKINSON

Attesting Officer

*Commissioner of Patents and Trademarks*